United States Patent [19]
Omori et al.

[11] Patent Number: 5,671,123
[45] Date of Patent: Sep. 23, 1997

[54] IC CARD WITH A DISCHARGE PATTERN AND A GROUND PATTERN SEPARATED FROM EACH OTHER

[75] Inventors: Makoto Omori; Katsunori Ochi; Jun Ohbuchi; Tetsuro Washida, all of Tokyo, Japan

[73] Assignee: Mitsubishi Denki Kabushiki Kaisha, Tokyo, Japan

[21] Appl. No.: 555,706

[22] Filed: Nov. 14, 1995

[30] Foreign Application Priority Data

Dec. 14, 1994 [JP] Japan .................................. 6-310931

[51] Int. Cl.⁶ .............................. H05K 1/14; H05K 9/00
[52] U.S. Cl. ........................ 361/737; 361/212; 361/220; 361/753; 361/777; 361/816
[58] Field of Search .......................... 361/737, 738, 361/741, 748, 753, 769, 775, 777, 799, 800, 816, 818, 212, 220; 174/51

[56] References Cited

U.S. PATENT DOCUMENTS

| | | | |
|---|---|---|---|
| 5,206,796 | 4/1993 | Thomson et al. | 174/51 X |
| 5,210,442 | 5/1993 | Ishimoto | 257/679 |
| 5,381,159 | 1/1995 | Oohori | 361/212 X |
| 5,414,253 | 5/1995 | Baudouin et al. | 361/737 X |

FOREIGN PATENT DOCUMENTS

| | | |
|---|---|---|
| 251293 | of 1990 | Japan . |
| 2120095 | of 1990 | Japan . |
| 3262695 | of 1991 | Japan . |

*Primary Examiner*—Leo P. Picard
*Assistant Examiner*—Jayprakash N. Gandhi
*Attorney, Agent, or Firm*—Leydig, Voit & Mayer, Ltd.

[57] ABSTRACT

An IC card including an electric circuit board and have face and back metallic panels that include a housing and are attached to a resin frame. The IC card has a discharge pattern formed on the electric circuit board for discharging static electricity applied to the metallic panels, a conductor elastically disposed between one of the metallic panels and the discharge pattern for electrically coupling one of the metallic panels with the discharge pattern, and a ground pattern formed on the electric circuit board with the ground pattern separated by a given distance A from the discharge pattern for routing the static electricity to a card connector. The given distance A is a distance necessary for the static electricity to start discharging at a given voltage. A given distance needed for discharge can be maintained precisely through a simple manufacturing process. A fluctuation in discharge start voltage can therefore be minimized. This results in a highly reliable product.

20 Claims, 11 Drawing Sheets

IC CARD WITH A DISCHARGE PATTERN AND A GROUND PATTERN SEPARATED FROM EACH OTHER

BACKGROUND OF THE INVENTION

1. FIELD OF THE INVENTION

The present invention relates to an IC card for use as an external storage medium for a computer or the like.

2. DESCRIPTION OF THE RELATED ART

A known IC card will be described with reference to FIGS. 23 and 24. FIG. 23 shows the overall structure of a known IC card. FIG. 24 is a sectional view showing of the known IC card of FIG. 23 taken along section line 24—24. The prior art shown in FIG. 24 is devised exclusively for explanation of the present invention.

In FIGS. 23 and 24, a known IC card 100 comprises a resin frame 1, face and back metallic panels 2 and 3 attached to the resin frame 1 with an adhesive 10, and a card connector 4 having a plurality of holes associated with pins of a connector of a system not illustrated. The face and back metallic panels 2 and 3 are electrically coupled with each other at junctions 11. The junctions 11 are created at several positions on both sides of the IC card 100.

The face and back of the IC card 100 is determined as described below. When the IC card 100 is placed with the card connector 4 set at the deepest end and a hole 4a associated with the first pin set on the leftmost side, the top of the IC card 100 is regarded as the face thereof and the bottom thereof is regarded as the back thereof. The metallic panel 2 is therefore the face of the IC card 100 and the metallic panel 3 is the back thereof.

In the same drawings, electronic parts 6 are soldered onto an electric circuit board 5 supported by the resin frame 1 and incorporated in the IC card 100. A discharge member 9 is mounted on a ground (GND) pattern 7 using solder 8.

A cubical metallic fragment or electronic part is used as the discharge member 9. The metallic fragment is what is readily soldered and resistive to corrosion, for example, a gold-plated beryllium copper. The electronic part is what has the same capability as the metallic fragment, for example, a discharge capacitor.

As mentioned above, the IC card 100 which may be used as an external storage medium for a computer or the like has the metallic panels 2 and 3 as the face and back of an IC card in an effort to protect the incorporated electronic circuitry from external static electricity. However, if the metallic panels 2 and 3 have excessive static electricity applied thereto, the static electricity must be routed to a ground (GND) terminal in a main unit of a system via a ground (GND) terminal of the incorporated electric circuit board 5. In the known IC card 100, therefore, the discharge member 9 must be, as shown in FIG. 24, separated by a given distance A from the metallic panel 2 in order to discharge an excess of static electricity.

A route through which excessive static electricity flows starts at the metallic panel 2 or 3, passes the discharge member 9, ground pattern 7, and ground terminal of the card connector 4, and then reaches the ground terminal in the system via the ground terminal (not shown) of the connector in the system.

The necessity of retaining the given distance A will be explained below. When the given distance A equals zero (contact state) or is very small, even very weak static electricity flows into the system all the time. This causes the voltage in the system to fluctuate. There arises a risk that the system runs incorrectly. With the given distance A retained, only the excess of static electricity over the amount of static electricity which an IC card can withstand is routed into the system. Thus, the continuous fluctuation in voltage in the system is suppressed. When the given distance A is large, even if excessive static electricity which an IC card cannot withstand is applied, discharge is not started. This leads to a malfunction of the IC card or a destruction of an incorporated semiconductor device.

A practical numerical value of the given distance A that is a designed value will be determined as described below. A discharge length L is expressed as $0<L<(Vs/E)$. Herein, Vs denotes a voltage (volt) at which a designer wants discharge to start. E denotes an electric field in the air which is calculated as 3.0 by $10^6$ (V/m). Assuming that the voltage Vs at which discharge should start is 1.5 kV, the discharge length L (m) is expressed as $0<L<0.5*10^{-3}$ (where * shall be a multiplication sign). The given distance A is calculated as 0.5 mm.

The aforesaid IC card has the structure shown in FIG. 24. The IC card therefore has many uncertain factors; such as, deformation of the metallic panel 2, precision in shape of the resin frame 1, and precision in height of the ground pattern 7 on the electric circuit board 5. The given distance A needed to evade only the excess of static electricity cannot be preserved.

SUMMARY OF THE INVENTION

The present invention attempts to solve the foregoing problem. An object of the present invention is to provide an IC card in which a given distance A can be preserved with high precision and a fluctuation in discharge start voltage can be minimized.

An IC card in accordance with the present invention comprises a resin frame, metallic panels attached to the resin frame, a card connector having a plurality of holes, an electric circuit board supported by the resin frame, a discharge means disposed between the electric circuit board and one of the metallic panels for discharging static electricity applied to the metallic panels, and a ground means formed on the electric circuit board with the ground means separated by a predetermine distance, which is necessary for the static electricity to start discharging at a given voltage, from the discharge means in order to route the static electricity into the card connector.

The discharge means and ground means are separated from each other by the distance necessary for the static electricity to start discharging at the given voltage. Thus, a given distance needed for discharge can be preserved precisely, and a fluctuation in discharge start voltage can be minimized. This results in a highly reliable product.

DESCRIPTION OF THE PREFERRED EMBODIMENTS

First Embodiment

Figure 1:
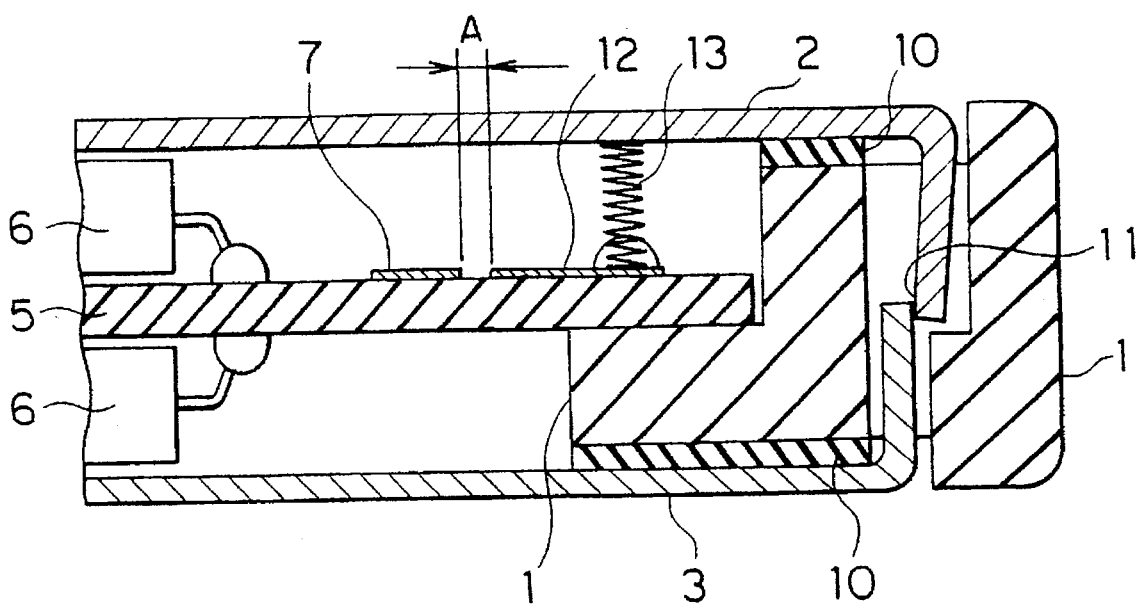
FIG. 1 shows a section of part of the first embodiment of the present invention.
Figure 2:
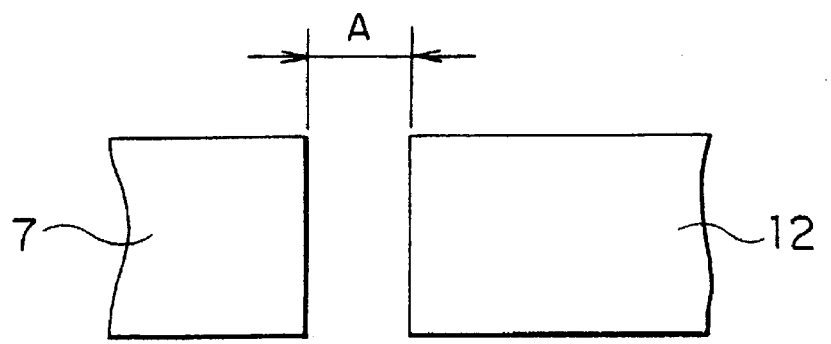
FIG. 2 is a plan view showing a ground pattern and discharge pattern in the first embodiment of the present invention.
Figure 3:
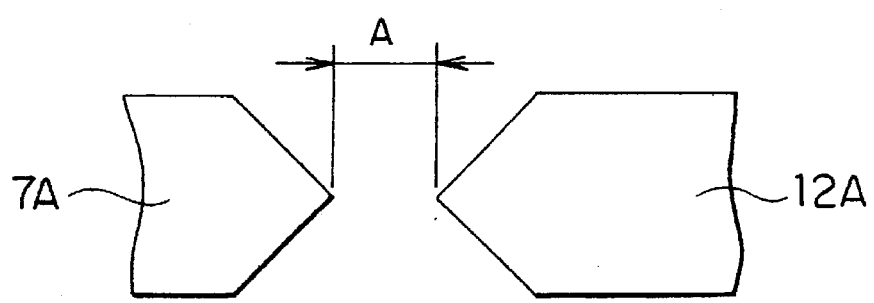
FIG. 3 is a plan view showing another ground pattern and discharge pattern in the first embodiment of the present invention.
Figure 4:
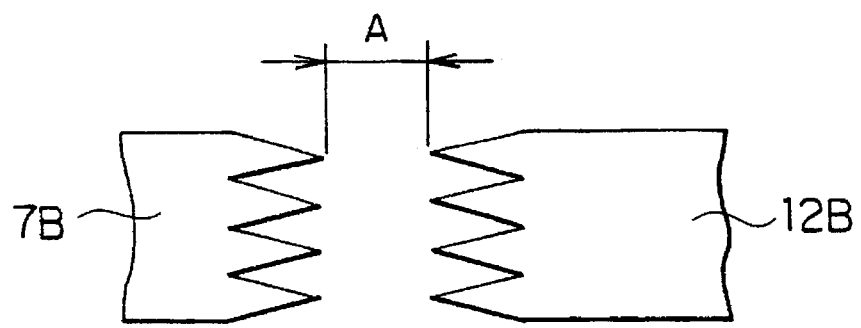
FIG. 4 is a plan view showing yet another ground pattern and discharge pattern in the first embodiment of the present invention.
Figure 5:
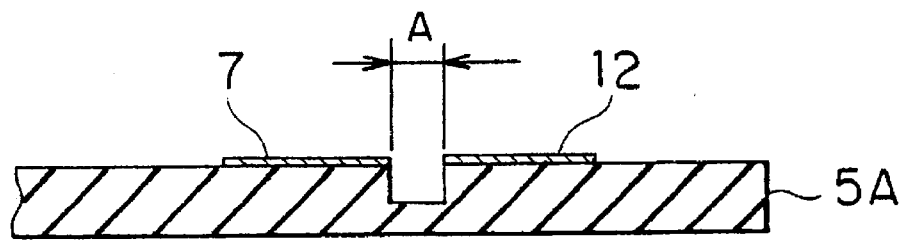
FIG. 5 shows a section of an electric circuit board in the first embodiment of the present invention.
Figure 6:
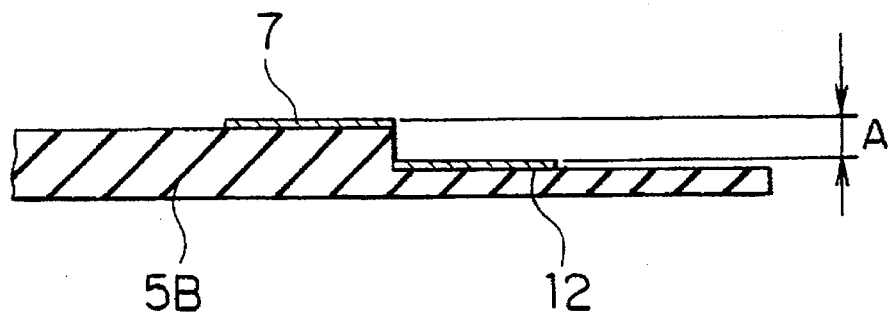
FIG. 6 shows a section of another electric circuit board in the first embodiment of the present invention.
Figure 7:
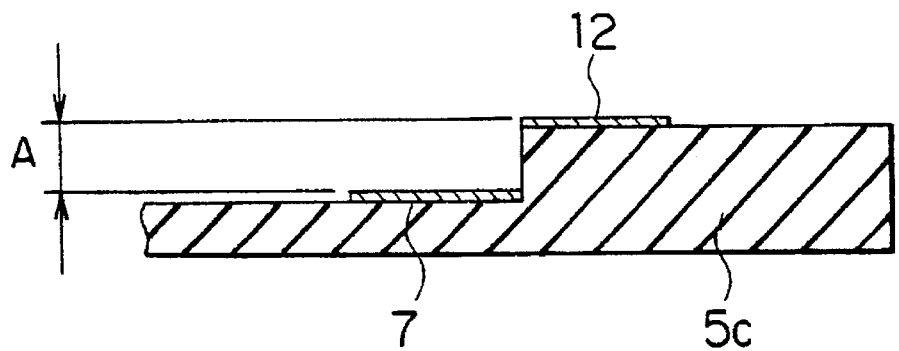
FIG. 7 shows a section of yet another electric circuit board in the first embodiment of the present invention.

Referring to FIGS. 1 to 7, the first embodiment of the present invention will be described below. FIG. 1 shows a section of part of the first embodiment of the present invention. FIGS. 2 to 4 show the shapes of a ground pattern and discharge pattern in accordance with the first embodiment. FIGS. 5 to 7 are side views showing an electric circuit board in accordance with the first embodiment. In the drawings, the same reference numerals denote the same or equivalent components.

As illustrated in FIG. 1, an IC card 100A comprises a resin frame face and back metallic panels 2 and 3 attached to the resin frame with an adhesive 10 between them, and a card connector. The face and back metallic panels 2 and 3 are electrically coupled with each other at junctions 11.

In FIG. 1, electric parts 6 are mounted on an electric circuit board 5 incorporated in the IC card 100A by means of soldering or the like. A ground (GND) pattern 7, a discharge pattern 12 separated by a given distance A from the ground pattern 7, and an elastic conductive member 13 soldered to the discharge pattern 12 for electrically coupling the discharge pattern 2 with the metallic panel 2 are mounted on the electric circuit board 5.

The discharge pattern 12 is used to discharge voltage externally applied to the metallic panels 2 and 3. The conductive member 13 is, for example, a coil spring made of stainless steel (SUS), conductive rubber, steel wool (wire sponge) or the like, which is elastic.

The ground pattern 7 and discharge pattern 12 are copper-foiled patterns provided in the form of general printed-circuit boards (copper-foiled laminated board), and formed on the electric circuit board 5 simultaneously with other circuit patterns by means of etching or any other patterning process. The conductive member 13 is then mounted on the discharge pattern 12 using solder. The electric circuit board 5 is then attached to the step (inner margin) of the resin frame 1. The face and back metallic panels 2 and 3 are then attached to the resin frame 7 using the adhesive 10.

The ground pattern 7 and discharge pattern 12 may be formed on the bottom (back) of the electric circuit board 5. In this case, the conductive member 13 is disposed between the discharge pattern 12 and the back metallic panel 3. The conductive member 13 may be placed in such a way that it will penetrate a hole formed in the step of the resin frame 1. This structure makes it easy to position the conductive member 13.

According to the first embodiment, the ground pattern 7 and discharge pattern 12 are provided in the form of electric circuit patterns and used as static electricity discharge terminals. The given distance A needed for discharge can be preserved precisely and readily. Consequently, a fluctuation in discharge start voltage can be minimized. This results in a highly reliable product.

The shapes of the ground pattern 7 and discharge pattern 2 will be described. To begin with, the ground pattern 7 and discharge pattern 12 shown in FIG. 2 have the linear sides thereof opposed to each other. The given distance A can be preserved within a minimum necessary area.

In FIG. 3, the ground pattern 7 and discharge pattern 12 have the crested ends thereof opposed to each other. This shape offers an advantage in that the edge effect facilitates a discharge phenomenon.

In FIG. 4, the ground pattern 7 and discharge pattern 12 have the sawtooth ends thereof opposed to each other. This shape provides the same effect as the one exerted when a plurality of discharge terminals (in this example, four pairs of terminals) are installed. Even if one pair of discharge terminals degrades the discharge ability due to carbonization of the edges caused by discharge, the other discharge terminals enable repetitive discharge. In other words, performance that has deteriorated because of discharge terminal degradation due to a discharge phenomenon can be recovered.

The structure of the electric circuit board 5 is described, below. In FIG. 5, a circuit board 5A (whose thickness is, for example, about 0.5 mm) comprises a ditch; (with a depth of, for example, 0.2 mm) at a position between the ground pattern 7 and discharge pattern 12. This structure offers an advantage that a given distance A can be set to any value through numeric control or any other post-machining using a cutter. That is to say, the given distance A needed for discharge can be modified readily without the necessity of re-designing parts.

In FIG. 6, a circuit board 5B comprises a step at a position between the ground pattern 7 and discharge pattern 12. A given distance A can be set to any value by changing the height of the step or the thickness of the discharge pattern 12. As for the thickness of the circuit board 5B, the thicker portion has, for example, a thickness of about 0.7 mm and the thinner portion has, for example, a thickness of about 0.2 mm. The ground pattern 7 and discharge pattern 12 have a thickness of about 20 μm. In FIG. 6, the discharge pattern 12 is situated on a lower step. By contrast, the discharge pattern 12 may be situated on a higher step. Alternatively, as presented as a circuit board 5C in FIG. 7, the thicker and thinner portions may be reverse of those in FIG. 6.

Second Embodiment

Figure 8:
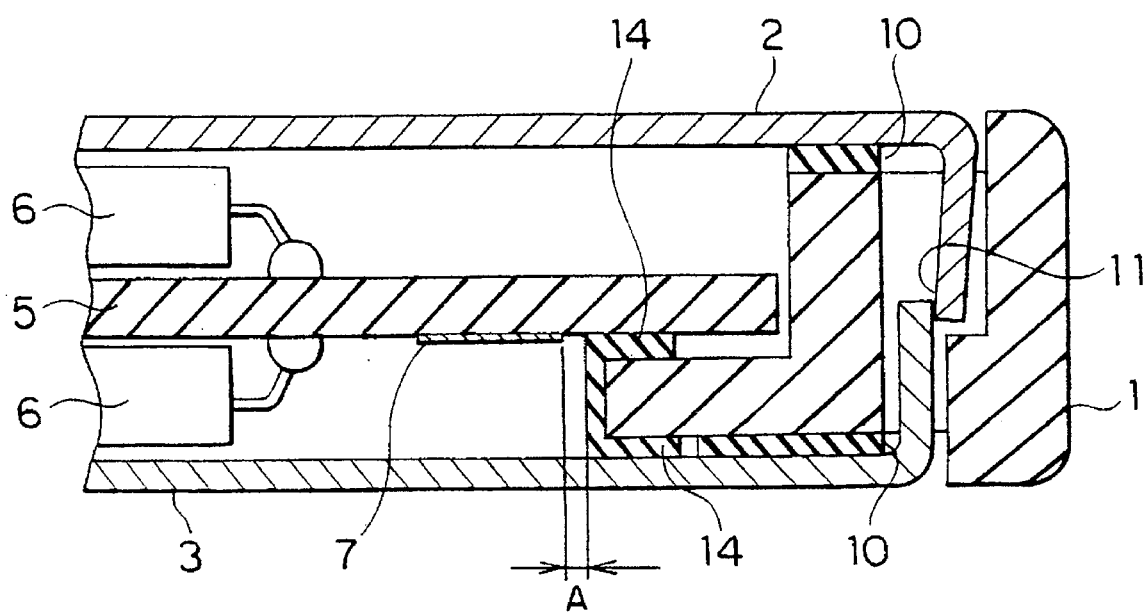
FIG. 8 shows a section of part of the second embodiment of the present invention.
Figure 9:
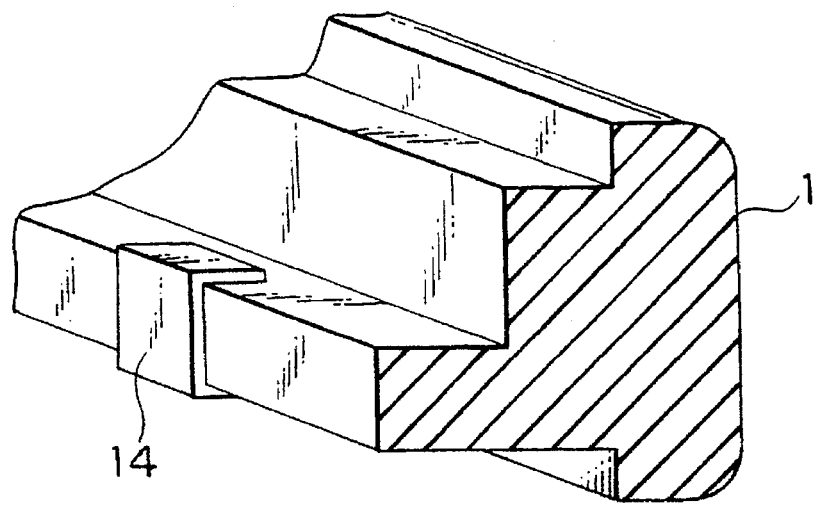
FIG. 9 is a perspective view showing a discharge member in the second embodiment of the present invention.

The second embodiment of the present invention will be described with reference to FIGS. 8 and 9. FIG. 8 shows a section of the IC card part of the second embodiment of the present invention. FIG. 9 is a perspective view showing a discharge member in the second embodiment.

In FIGS. 8 and 9, an IC card 100B has a conductive discharge member 14 clamped onto a step of a resin frame 1. The discharge member 14 has a section shaped like a letter C and substantially the same thickness as an adhesive 10. The discharge member 14 is clamped onto the step and is, for example, a clamp. Part 14a of the discharge member 14 is press-fitted to the metallic panel 3 and thus electrically coupled to the metallic panel 3. In FIG. 9, a hollow region in the resin frame 2 in which a junction 11 is stowed is not illustrated.

The ground pattern 7 is, as shown in FIG. 8, formed on the electric circuit board 5 and separated by a given distance A from the discharge member 14. The other components of the IC card 100B are identical to those of the first embodiment.

According to the second embodiment, the discharge member 14 is clamped directly onto the resin frame 1. A metallic panel whose warp is an uncertain factor is not involved in determining a given distance the. The given distance A can be preserved on a stable basis. In other words, the given distance A needed for discharge can be maintained with great precision. Consequently, a fluctuation in discharge start voltage can be minimized. This results in a highly reliable product.

Third Embodiment

Figure 10:
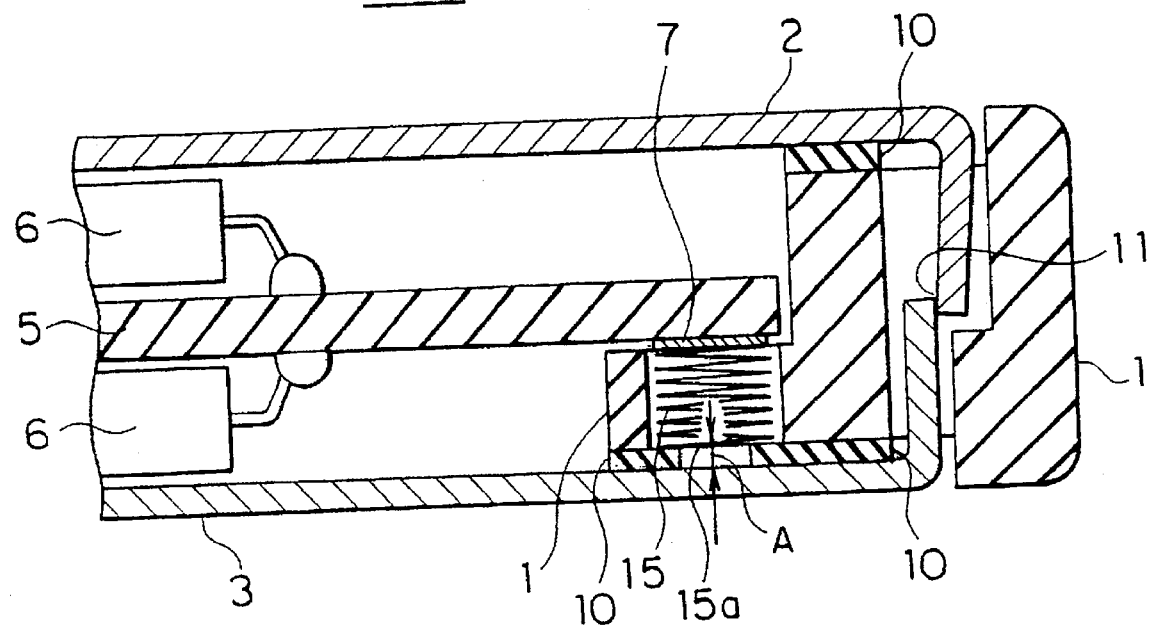
FIG. 10 shows a section of part of the third embodiment of the present invention.
Figure 11:
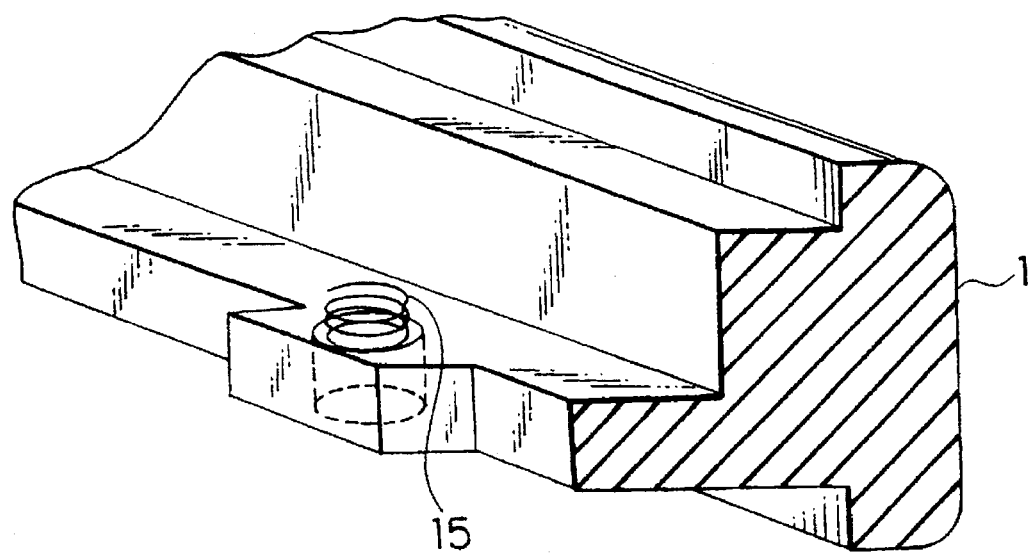
FIG. 11 is a perspective view showing a discharge member in the third embodiment of the present invention.

The third embodiment of the present invention will be described with reference to FIGS. 10 and 11. FIG. 10 shows a section of part of the IC card of the third embodiment of the present invention. FIG. 11 is a perspective view showing a discharge member in the third embodiment.

In FIGS. 10 and 11, an IC card 100C has a ground (GND) pattern 7 formed on an electric circuit board 5, and an elastic discharge member 15 abutting on the ground pattern 7. The discharge member 15 is, for example, a coil spring made of stainless steel (SUS), conductive rubber, steel wool (wire sponge), or the like, which is elastic. The discharge member 15 is stowed in a through hole formed in a jut of a step of a resin frame 1. One end 15a of the discharge member 15 is separated by a given distance A from the metallic panel 3 for example, due to the thickness of an adhesive 10. In FIG. 11, a hollow of the resin frame 1 for stowing a junction 11 is not illustrated.

According to the third embodiment, the given distance A is preserved due to the thickness of the adhesive 10. When an uncertain factor such as the warp of a metallic panel or the height of the circuit board 5 from the bottom of the card varies, the given distance A can be changed according to the variation. The given distance A can therefore be maintained on a stable basis. In other words, the given distance A needed for discharge can be preserved with great precision. Consequently, a fluctuation in discharge start voltage can be minimized. This results in a highly reliable product.

Fourth Embodiment

Figure 12:
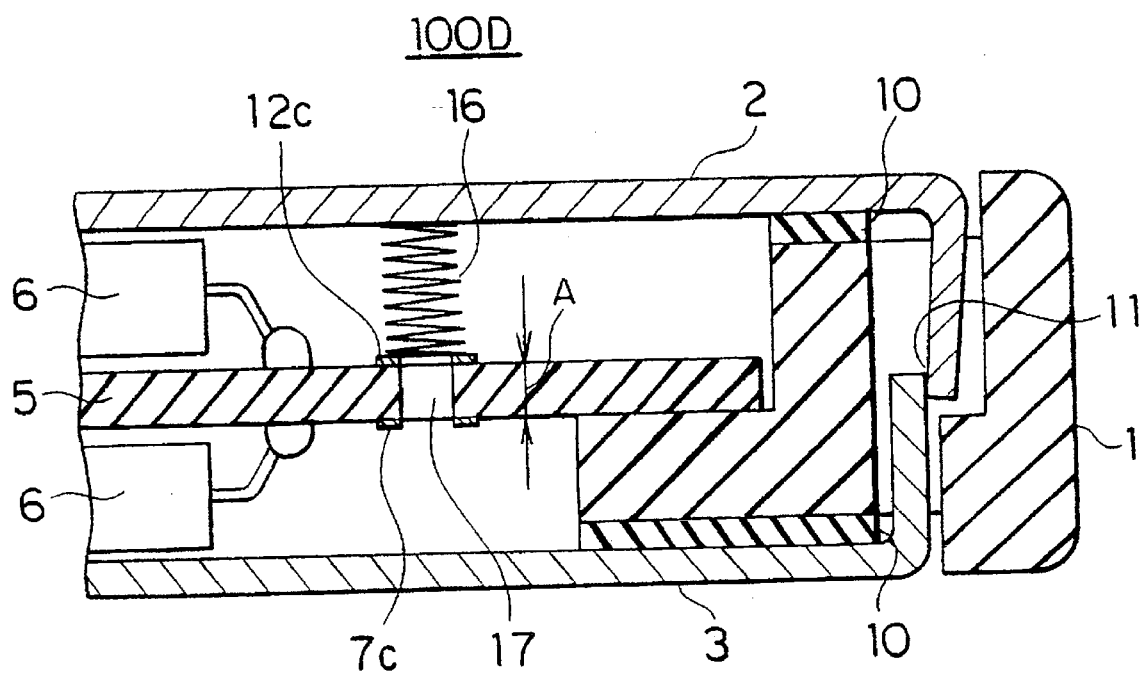
FIG. 12 shows a section of part of the fourth embodiment of the present invention.
Figure 13:
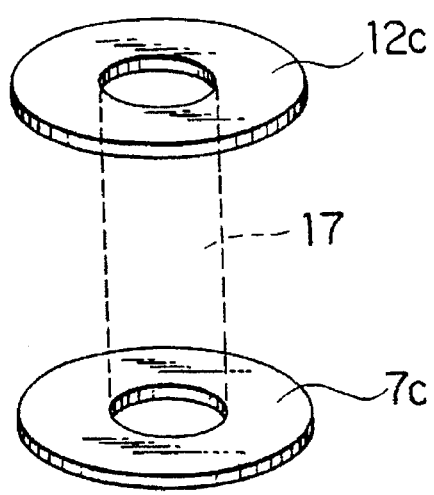
FIG. 13 is a perspective view showing a ground pattern and discharge pattern in the fourth embodiment of the present invention.

The fourth embodiment of the present invention will be described with reference to FIGS. 12 and 13. FIG. 12 shows a section of part of the IC card of the fourth embodiment of the present invention. FIG. 13 is a perspective view showing a ground pattern and a discharge pattern in the fourth embodiment.

In FIGS. 12 and 13, an IC card 100D has a ground (GND) pattern 7C shaped like a doughnut and formed on the back of an electric circuit board 5, a discharge pattern 12C shaped like a doughnut and formed on the face of the electric circuit board 5 for discharging voltage externally applied to a metallic panel 2, and a conductive member 16 for electrically coupling the discharge pattern 12C with the metallic panel 2.

The conductive member 16 is, for example, a coil spring made of stainless steel (SUS), conductive rubber, or the like, which is elastic. Reference numeral 17 denotes a cylindrical hole which is formed in the electric circuit board 5 in such a way that it communicates with the holes of the ground pattern 7C and discharge pattern 12C. The diameter of the cylindrical hole 17 is, for example, about 0.3 mm. Circular pads are formed at opposed positions on the face and back of a printed-circuit board during a typical manufacturing process. The cylindrical hole 17 is then drilled using a small-diameter drill in the course of post-machining. The ground pattern 7C, discharge pattern 12C, and conductive member 16 may be installed at opposite positions in terms of the face and back of the electric circuit board 5.

According to the fourth embodiment, the thickness of the electric circuit board 5 is comparable to a given distance A. The given distance A needed for discharge can therefore be maintained more precisely. Since the given distance A is maintained in the direction of a section of the electric circuit board 5, an area on the face of the electric circuit board 5 in which electronic parts are arranged will not be sacrificed. In other words, the given distance A can be maintained within a minimum necessary area. A discharge terminal composed of the ground pattern 7C and discharge pattern 12C can be constructed readily.

Fifth Embodiment

Figure 14:
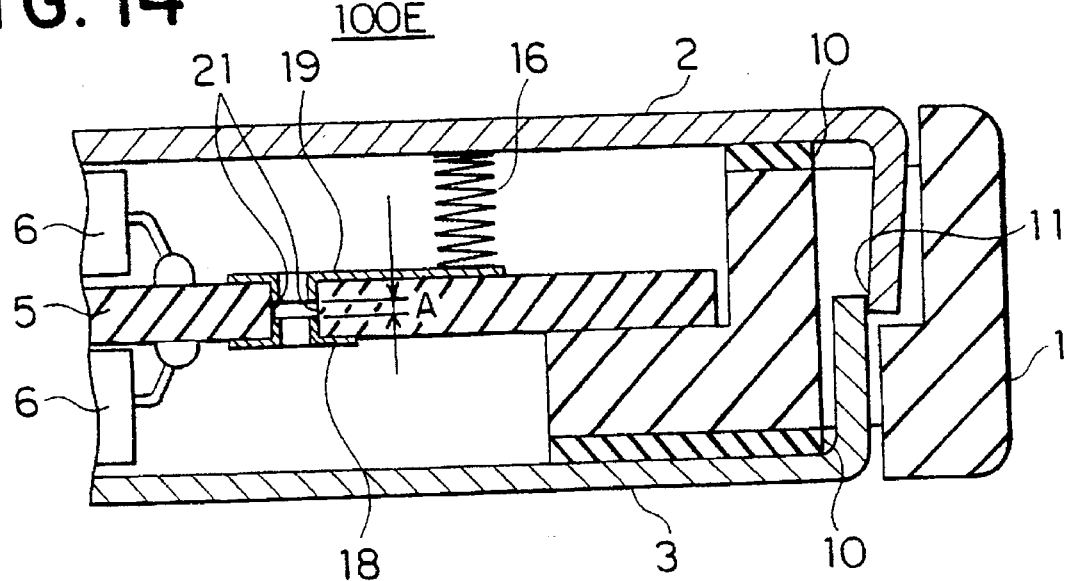
FIG. 14 shows a section of part of the fifth embodiment of the present invention.
Figure 15:
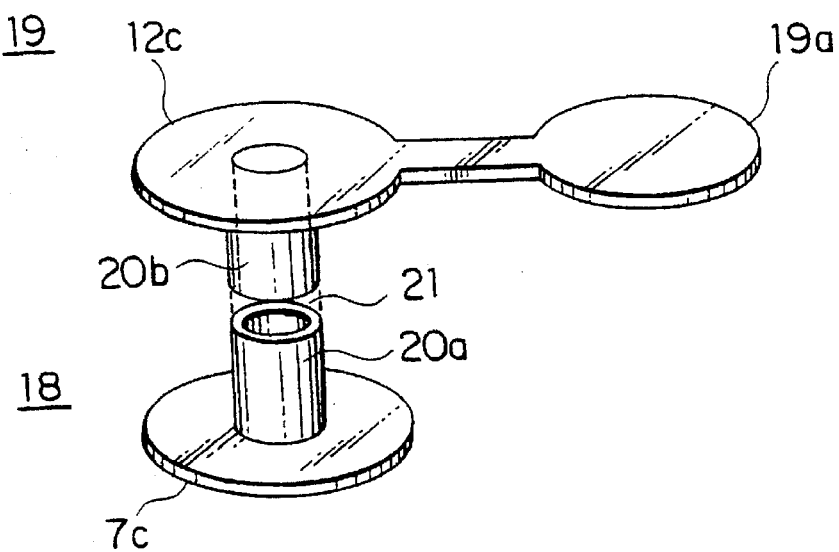
FIG. 15 is a perspective view showing a ground member and discharge member in the fifth embodiment of the present invention.
Figure 16:
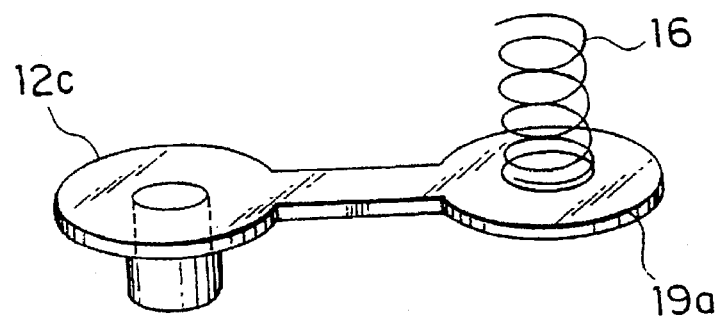
FIG. 16 is a perspective view showing a conductive member in the fifth embodiment of the present invention.

The fifth embodiment of the present invention will be described with reference to FIGS. 14, 15, and 16. FIG. 14 shows a section of part of the fifth IC card of the embodiment of the present invention. FIGS. 15 and 16 are perspective views showing a ground member, discharge member, and conductive member in the fifth embodiment.

In FIGS. 14 to 16, an IC card 100E has a ground member 18 formed on the back of an electric circuit board 5, a discharge member 19 formed on the face of the electric circuit board for discharging voltage externally applied to a metallic panel 2, and a conductive member 16 for electrically coupling the discharge member 19 with the metallic panel 2.

In the same drawings, the ground member 18 comprises a ground pattern 7C and a cylinder 20a. The discharge member 19 comprises a discharge pattern 12C, a cylinder 20b, and a loading pattern 19a on which the conductive member 16 is loaded.

Reference numeral 21 denotes an arbitrary portion of a cylindrical hole in which a plate is removed or not deposited by a given distance A. The cylinders 20a and 20b have a diameter of, for example, about 1.0 mm. For maintaining the given distance A, a cylindrical hole is first drilled according to the same process as that in the fourth embodiment. The inside of the cylindrical hole is then plated in order to form the cylinders 20a and 20b. In short, the given distance A is maintained by depositing plates (step by step).

According to the fifth embodiment, the given distance A is maintained in the direction of a section of the electric circuit board 5. An area on the face of the electric circuit board 5 in which electronic parts are arranged will therefore not be sacrificed. The given distance A is preserved in a cylindrical hole of the circuit board 5. The given distance A may therefore be set to a very small value. Similarly to the fourth embodiment, the loading pattern 19a may be removed, and the conductive member 16 may be placed on the discharge pattern 12C.

Sixth Embodiment

Figure 17:
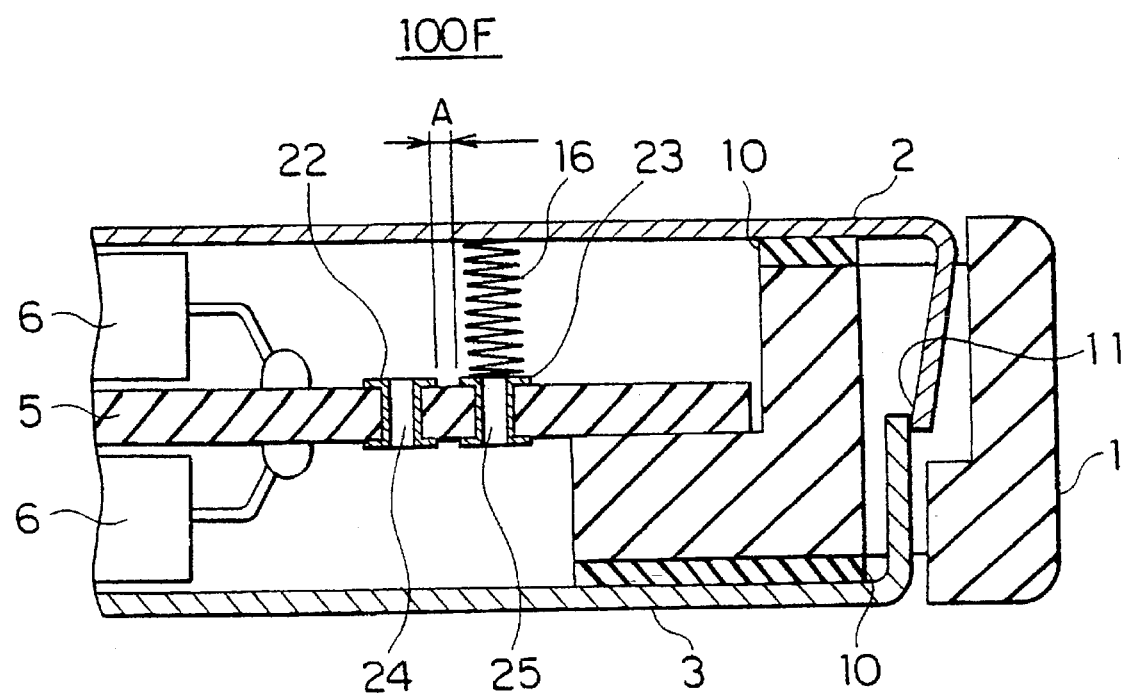
FIG. 17 shows a section of part of the sixth embodiment of the present invention.
Figure 18:
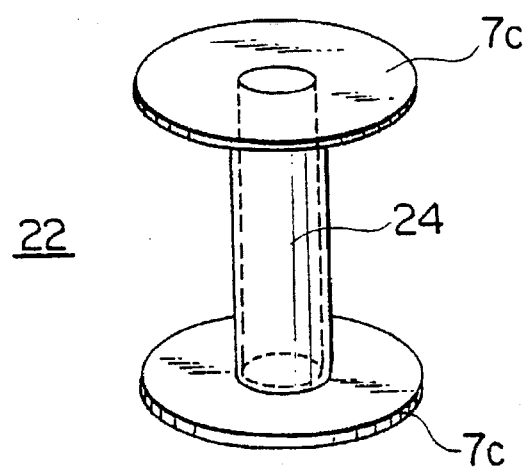
FIG. 18 is a perspective view showing a ground member in the sixth embodiment of the present invention.

The sixth embodiment of the present invention will be described with reference to FIGS. 17 and 18. FIG. 17 shows a section of part of the IC card of the sixth embodiment of the present invention. FIG. 18 is a perspective view showing a ground member in the sixth embodiment.

In FIGS. 17 and 18, an IC card 100F has a discharge member 23 formed in and on an electric circuit board 5 for discharging voltage externally applied to a metallic panel 2, a ground member 22 formed in and on the electric circuit board 5 with the ground member 22 separated by a given distance A from the discharge member 23, and a conductive member 16 for electrically coupling the discharge member 23 with the metallic panel 2.

As shown in FIG. 18, the ground member 22 comprises ground patterns 7C formed on the face and back of the electric circuit board 5, and a through hole 24 for electrically coupling the ground patterns 7C. The discharge member 23 comprises discharge patterns 12C formed on the face and back of the electric circuit board 5 and a through hole 25 for electrically coupling the discharge patterns 12C.

Herein, a through hole serves as a conductor for electrically coupling the electric circuits formed on the face and back of the circuit board. The through holes 24 and 25 are formed by drilling cylindrical holes according to the same process as that in the fourth embodiment and then plating the insides of the holes. The diameters of the through holes 24 and 25 are, for example, about 0.3 mm. The through holes 24 and 25 are formed simultaneously with the other through holes in electric circuits. The given distance A can therefore be maintained readily.

According to the sixth embodiment, the ground member 22 comprises the ground patterns 7C and through hole 24, and the discharge member 23 comprises the discharge patterns 12C and through hole 25. The ground member 22 and discharge member 23 can therefore be formed readily. Furthermore, the given distance A needed for discharge can be preserved precisely. A fluctuation in discharge start voltage can be minimized. This results in a highly reliable product.

Seventh Embodiment

Figure 19:
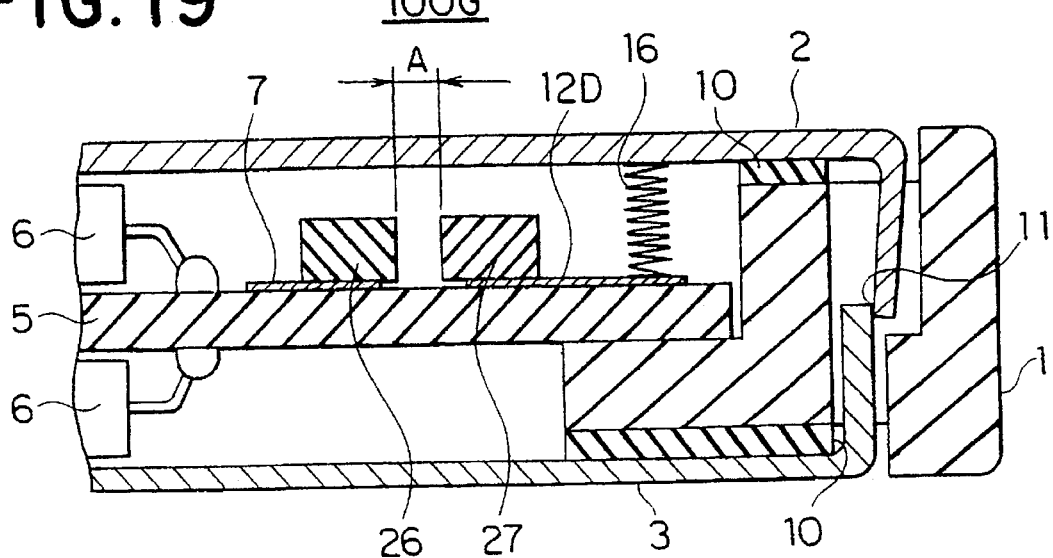
FIG. 19 shows a section of part of the seventh embodiment of the present invention.
Figure 20:
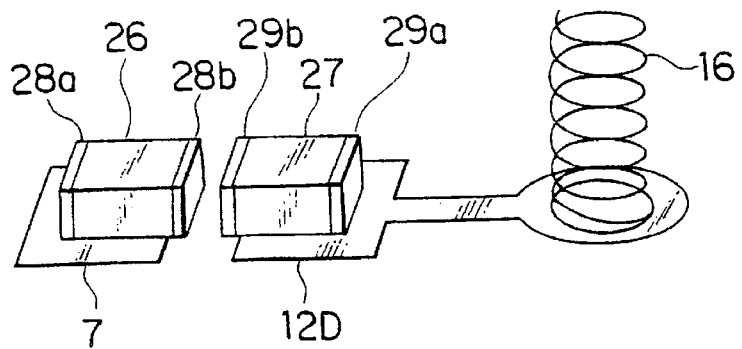
FIG. 20 is a perspective view showing the layout of a ground pattern, discharge pattern, conductive member, and electronic parts in the seventh embodiment of the present invention.

The seventh embodiment of the present invention will be described with reference to FIGS. 19 and 20. FIG. 19 shows a section of part of the IC card of the seventh embodiment of the present invention. FIG. 20 is a perspective view showing a ground pattern and a discharge pattern in the seventh embodiment.

In FIGS. 19 and 20, an IC card 100G has a discharge pattern 12D formed on an electric circuit board 5 for discharging voltage externally applied to a metallic panel 2, a conductive member 16 for coupling the discharge pattern 12D with the metallic panel 2, a ground (GND) pattern 7 opposed to the discharge pattern 12D, an electronic part 27 loaded on the discharge pattern 12D, and an electronic part 26 loaded on the ground pattern 7 with a given distance A retained between the electronic parts 26 and 27.

Electrodes 28a and 28b, and 29a and 29b are formed at margins of the electronic parts 26 and 27. The pairs of electrodes are electrically coupled with each other by way of the insides of the electronic parts 26 and 27. The electrodes 28b and 29b with the given distance A between them project beyond the mutually opposed sides of the ground pattern 7 and discharge pattern 12D. The electrode 28a formed as the other margin of the ground pattern 7 and the electrode 29a of the discharge pattern 12D are electrically coupled with the associated patterns by soldering.

According to the seventh embodiment, the electronic parts 26 and 27 are used as discharge terminals. The discharge terminals can be formed simultaneously with the other electronic parts 6 and therefore formed readily. Moreover, the given distance A can be modified easily by changing the positions at which the electric parts are mounted. Furthermore, when discharge precision is degraded due to carbonization of an electrode caused by a discharge phenomenon, initial discharge precision can be restored merely by replacing the electronic parts 26 and 27 with new ones.

Eighth Embodiment

Figure 21:
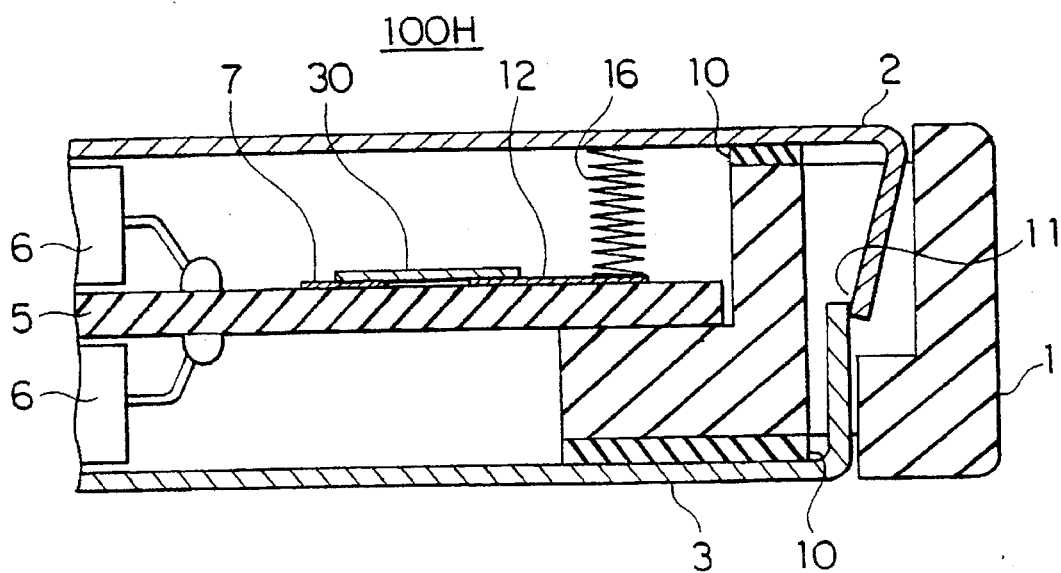
FIG. 21 shows a section of part of the eighth embodiment of the present invention.
Figure 22:
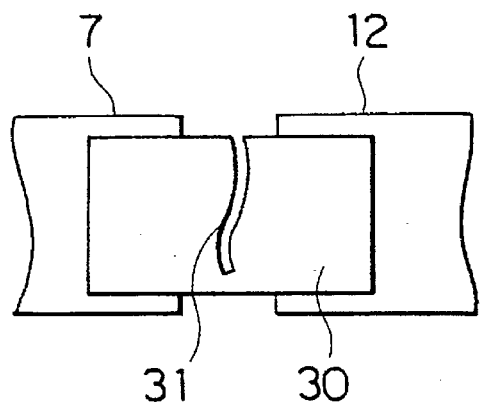
FIG. 22 shows a paste type resistor in FIG. 21.
Figure 23:
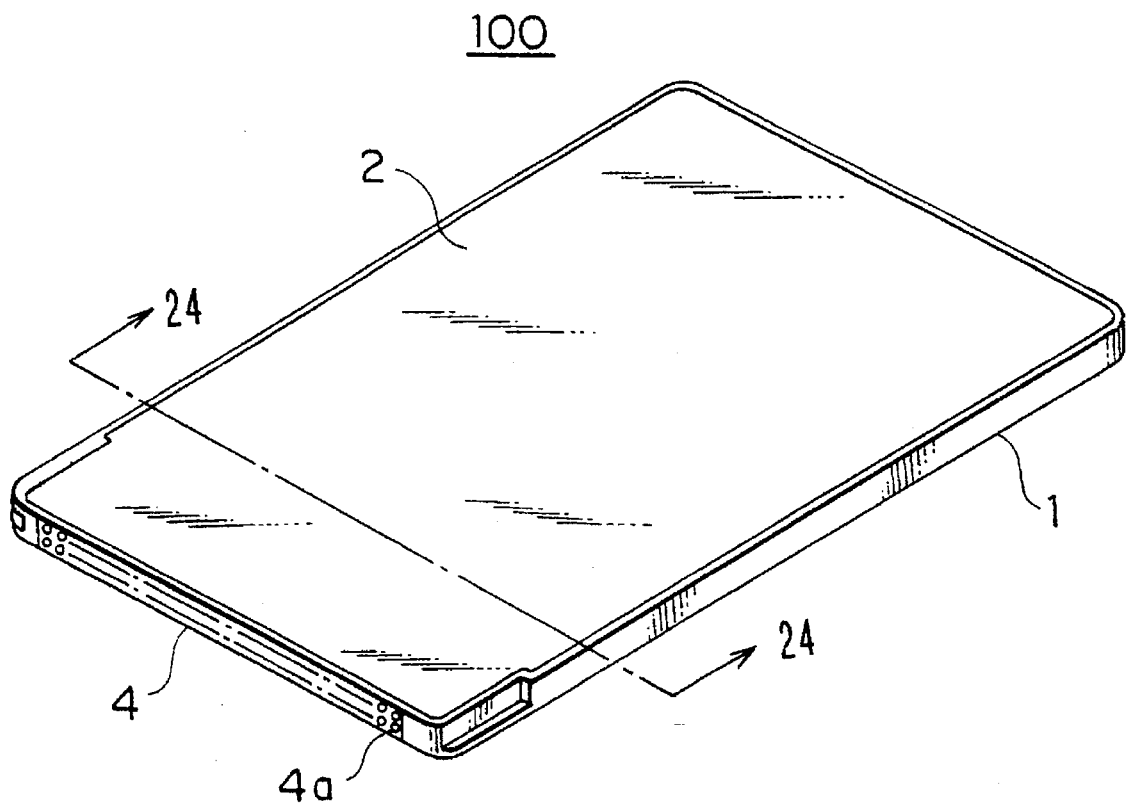
FIG. 23 shows the appearance of an IC card in accordance with the present invention and known art alike.
Figure 24:
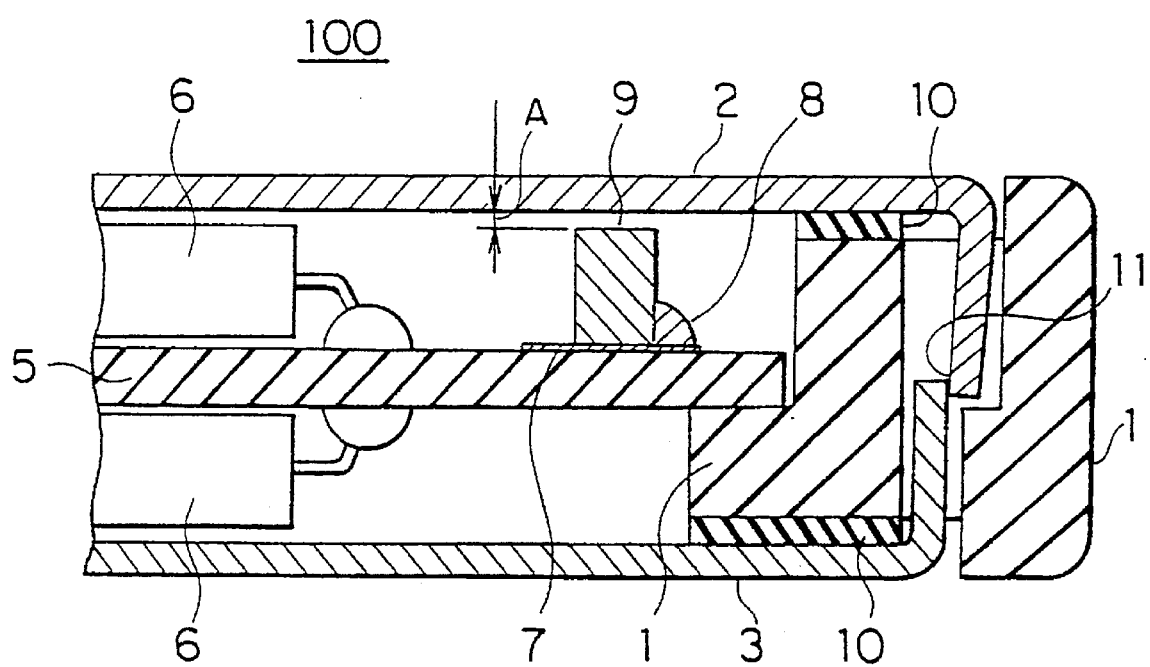
FIG. 24 shows a section of part of a known IC card.

The eighth embodiment of the present invention will be described with reference to FIGS. 21 and 22. FIG. 21 shows a section of part of an IC card. FIG. 22 is a plan view showing a paste type resistor.

In FIGS. 21 and 22, an IC card 100H has a discharge pattern 12 formed on an electric circuit board 5 for discharging voltage externally applied to a metallic panel 2, a conductive member 16 for electrically coupling the discharge pattern 12 with the metallic panel 2, a ground (GND) pattern 7 opposed to the discharge pattern 12, and a paste type resistor 30 administered in order to link the discharge pattern 2 and ground pattern 7.

The composition of the paste type resistor 30 includes tin (Sn) and lead (Pb). The resistor 30 has a trimming created by a laser or the like. The resistor 30 is thus designed in conformity with the characteristic of an incorporated circuit. Specifically, a current induced by a potential difference may or may not be allowed to flow by controlling the resistance of the resistor 30 using the trimming 31.

According to the IC card 100H, the paste type resistor 30 is used as a variable resistor. A discharge resistance can be determined or modified readily and precisely.

What is claimed is:

1. An IC card, comprising:

a resin frame;

metallic panels attached to said resin frame;

a card connector having a plurality of holes;

an electric circuit board supported by said resin frame;

a discharge means disposed between said electric circuit board and one of said metallic panels for discharging static electricity applied to said metallic panels; and a ground means formed on said electric circuit board with said ground means separated from said discharge means by a distance necessary for said static electricity to start discharging at a given voltage for routing said static electricity to said card connector.

2. The IC card according to claim 1, wherein said discharge means includes a discharge pattern formed on said electric circuit board for discharging static electricity applied to said metallic panels and a conductive member that abuts on both said discharge pattern and one of said metallic panels so as to couple said discharge pattern with one of said metallic panels, and said conductive member is elastically disposed between said discharge pattern and one of said metallic panels, and wherein said ground means is a ground pattern formed on said electric circuit board with said ground pattern separated from said discharge pattern by a distance necessary for said static electricity to start discharging at a given voltage for routing said static electricity to said card connector.

3. The IC card according to claim 2, wherein said discharge pattern and ground pattern have linear sides thereof opposed to each other.

4. The IC card according to claim 2, wherein said discharge pattern and ground pattern have crested ends thereof opposed to each other.

5. The IC card according to claim 2, wherein said discharge pattern and ground pattern have sawtooth ends thereof opposed to each other.

6. The IC card according to claim 2, wherein said electric circuit board comprises a ditch at a position between said discharge pattern and ground pattern, and the width of said ditch is comparable to a distance necessary for said static electricity to start discharging at a given voltage.

7. The IC card according to claim 2, wherein said electric circuit board comprises a step at a position between said discharge pattern and ground pattern, and the height of said step is comparable to a distance necessary for said static electricity to start discharging at a given voltage.

8. The IC card according to claim 1, wherein said discharge means is a conductive discharge member disposed between one of said metallic panels and said electric circuit board in contact with one of said metallic panels for discharging static electricity applied to said metallic panels, and wherein said ground means is a ground pattern formed on said electric circuit board with said ground pattern separated from said discharge member by a distance necessary for said static electricity to start discharging at a given voltage for routing said static electricity to said card connector.

9. The IC card according to claim 1, wherein said discharge means includes a discharge pattern formed on one surface of said electric circuit board for discharging static electricity applied to said metallic panels and a conductive member that abuts on both said discharge pattern and one of said metallic panels so as to electrically couple said discharge pattern with one of said metallic panels, and said conductive member is elastically disposed between said discharge pattern and one of said metallic panels, and wherein said ground means is a ground pattern formed on the other surface of said electric circuit board with said ground pattern separated from said discharge pattern by a distance necessary for said static electricity to start discharging at a given voltage for routing said static electricity to said card connector.

10. The IC card according to claim 9, wherein said discharge pattern and ground pattern are arranged at opposed positions on one surface and the other surface of said electric circuit board, a cylindrical hole is formed in said electric circuit board for communication with both of said holes of said patterns, said static electricity is discharged through said cylindrical hole, and the thickness of said electric circuit board is comparable to a given distance necessary for said static electricity to start discharging at a given voltage.

11. The IC card according to claim 1, wherein said discharge means includes a discharge member formed on one surface of said electric circuit board for discharging static electricity applied to said metallic panels and a conductive member that abuts on both of said metallic panels and said discharge member so as to couple one of said metallic panels with said discharge member, and wherein said ground means is a ground member formed at a position opposed to the position of said discharge member on the other surface of said electric circuit board with said ground member separated from said discharge member by a distance necessary for said static electricity to start discharging at a given voltage.

12. The IC card according to claim 11, wherein said discharge member includes a discharge pattern formed on one surface of said electric circuit board, a discharge cylinder formed along a cylindrical hole penetrating the face and back of said electric circuit board and coupled with said discharge pattern in order to discharge static electricity applied to said metallic panels, and a loading pattern on which said conductive member is loaded, wherein said conductive member is elastically disposed between one of said metallic panels and said discharge pattern, wherein said ground means includes a ground pattern formed at a position opposed to the position of said discharge pattern on the other surface of said electric circuit board for routing said static electricity to said card connector, and a ground cylinder formed along said cylindrical hole and coupled with said ground pattern, and wherein said discharge cylinder and ground cylinder are separated from each other by a distance necessary for said static electricity to start discharging at a given voltage.

13. The IC card according to claim 1, wherein said discharge means includes a discharge member formed in and on said electric circuit board for discharging static electricity applied to said metallic panels, and a conductive member that abuts on both of said metallic panels and said discharge member so as to electrically couple one of said metallic panels with said discharge member, and wherein said ground means is a ground member formed in and on said electric circuit board with said ground member separated from said discharge member by a distance necessary from said static electricity to start discharging at a given voltage for routing said static electricity to said card connector.

14. The IC card according to claim 13, wherein said discharge member includes first and second discharge patterns formed at opposed positions on the face and back of said electric circuit board for discharging static electricity applied to said metallic panels, and a discharge through hole that penetrates said face and back of said electric circuit board so as to electrically couple said first discharge pattern with said second discharge pattern, wherein said conductive member is elastically disposed between one of said metallic panels and said discharge pattern, wherein said ground means includes first and second ground patterns formed at opposed positions on said face and back of said electric circuit board and a ground through hole that penetrates said face and back of said electric circuit board so as to electrically couple said first ground pattern with said second ground pattern, and wherein a distance between said first discharge pattern and first ground pattern is comparable to a distance necessary for said static electricity to start discharging at a given voltage.

15. The IC card according to claim 1, wherein said discharge means includes a discharge pattern formed on said electric circuit board, a conductive member that abuts on both said discharge pattern and one of said metallic panels so as to electrically couple said discharge pattern with one of said metallic panels, and a first electronic part mounted on said discharge pattern in order to discharge static electricity applied to said metallic panels, and wherein said ground means includes a ground pattern formed on said electric circuit for routing said static electricity to said card connector, and a second electronic part mounted on said ground pattern with said second electronic part separated from said first electronic part by a distance necessary for said static electricity to start discharging at a given voltage.

16. The IC card according to claim 15, wherein said conductive member is elastically disposed between one of said metallic panels and said discharge pattern, wherein said first electronic part has first and second electrodes formed at both margins thereof and electrically coupled with each other via the inside thereof, wherein said second electronic part has third and fourth electrodes formed at both margins thereof and electrically coupled with each other via the inside thereof, and wherein said first electrode is electrically coupled with said discharge pattern, said third electrode is electrically coupled with said ground pattern, and said second and fourth electrodes are separated from each other by a distance necessary for said static electricity to start discharging at a given voltage.

17. An IC card, comprising:

a resin frame;

metallic panels coupled with said resin frame;

a card connector having a plurality of holes;

an electric circuit board supported by said resin frame;

a discharge means disposed between said electric circuit board and one of said metallic panels, and stowed in a through hole formed in a step of said resin frame with said discharge means separated from one of said metallic panels by a distance necessary for said static electricity to start discharging at a given voltage; and a ground means formed on said electric circuit board in contact with said discharge means for routing said static electricity to said card connector.

18. The IC card according to claim 17, wherein said discharge means is a discharge member formed on said resin frame with said discharge member separated by said given distance from one of said metallic panels via an adhesive for attaching one of said metallic panels to said resin frame, and wherein said ground means is a ground pattern formed on said electric circuit board in contact with said discharge member for routing said static electricity to said connector.

19. An IC card, comprising:

a resin frame;

metallic panels coupled with said resin frame;

a card connector having a plurality of holes;

an electric circuit board supported by said resin frame;

a discharge means disposed between said electric circuit board and one of said metallic panels for discharging static electricity applied to said metallic panels;

a ground means formed on said electric circuit board for routing said static electricity to said card connector; and a resistor means connected to each of said discharge means and ground means and provided with a given discharge resistance.

20. The IC card according to claim 19, wherein said discharge means includes a discharge pattern formed on said electric circuit board for discharging said static electricity applied to said metallic panels, and a conductive member that abuts on both said discharge pattern and one of said metallic panels so as to electrically couple said discharge pattern with one of said metallic panels, wherein said ground means is a ground pattern formed on said electric circuit board with said ground pattern separated by a given distance from said discharge pattern for routing said static electricity to said card connector, and wherein said resistor means is a paste type resistor having a discharge resistance controlled by a trimming in such an extent that it allows said static electricity to start discharging at a given voltage.

* * * * *